(12) United States Patent
Wiegele et al.

(10) Patent No.: US 7,203,394 B2
(45) Date of Patent: Apr. 10, 2007

(54) MICRO MIRROR ARRAYS AND MICROSTRUCTURES WITH SOLDERABLE CONNECTION SITES

(75) Inventors: Thomas Wiegele, Apple Valley, MN (US); Christopher Apanius, Moreland Hills, OH (US); Kenneth G. Goldman, Olmsted Township, OH (US); Shuwen Guo, Lakeville, MN (US); Loren E. St. Clair, Apple Valley, MN (US); Timothy R. O'Meara, Burnsville, MN (US); James J. Pohl, Apple Valley, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 60 days.

(21) Appl. No.: 10/620,119

(22) Filed: Jul. 15, 2003

(65) Prior Publication Data

US 2005/0013533 A1 Jan. 20, 2005

(51) Int. Cl.
*G02B 6/26* (2006.01)
(52) U.S. Cl. ...................................................... 385/18
(58) Field of Classification Search ................... 385/16, 385/18
See application file for complete search history.

(56) References Cited

U.S. PATENT DOCUMENTS

| | | | |
|---|---|---|---|
| 5,096,279 | A | 3/1992 | Hornbeck et al. |
| 5,721,162 | A | 2/1998 | Schubert et al. |
| 5,757,536 | A | 5/1998 | Ricco et al. |
| 5,923,995 | A | 7/1999 | Kao et al. |
| 6,291,317 | B1 | 9/2001 | Salatino et al. |
| 6,426,282 | B1 * | 7/2002 | Saigal et al. ............... 438/613 |
| 6,449,079 | B1 | 9/2002 | Herrmann |
| 6,525,864 | B1 * | 2/2003 | Gee et al. ................... 359/291 |
| 6,533,947 | B2 * | 3/2003 | Nasiri et al. ................ 216/2 |
| 6,587,613 | B2 * | 7/2003 | De Natale .................. 385/18 |
| 6,711,317 | B2 * | 3/2004 | Jin et al. ..................... 385/18 |

(Continued)

FOREIGN PATENT DOCUMENTS

| | | |
|---|---|---|
| JP | 06-120336 | 4/1994 |
| JP | 08-106614 | 4/1996 |

OTHER PUBLICATIONS

Graph of cure time vs. glass transition temperature for BCB (date unknown) Applicants admit the status of this graph as prior art for the limited purpose of examination of this application, but otherwise reserve the right to challenge the status of this publication as prior art.

(Continued)

*Primary Examiner*—Sung Pak
*Assistant Examiner*—Tina M Wong
(74) *Attorney, Agent, or Firm*—Thompson Hine LLP

(57) ABSTRACT

A micro mirror array including an upper wafer portion having a plurality of movable reflective surfaces located thereon, the upper wafer portion defining a coverage area in top view. The array further includes a lower wafer portion located generally below and coupled to the upper wafer portion. The lower wafer portion includes at least one connection site located thereon, the at least one connection site being electrically or operatively coupled to at least one component which can control the movement of at least one of the reflective surfaces. The at least one connection site is not generally located within the coverage area of the upper wafer portion.

39 Claims, 11 Drawing Sheets

U.S. PATENT DOCUMENTS

| 6,800,210 | B2* | 10/2004 | Patel et al. ..................... 216/2 |
|---|---|---|---|
| 6,946,321 | B1* | 9/2005 | Yegnashankaran et al. . 438/107 |
| 2001/0041381 | A1 | 11/2001 | Choi |
| 2001/0551143 | | 12/2001 | Atobe et al. |
| 2002/0110312 | A1 | 8/2002 | Yang et al. |
| 2002/0195673 | A1 | 12/2002 | Chou et al. |
| 2003/0107794 | A1 | 6/2003 | Siekkinen et al. |
| 2003/0118277 | A1* | 6/2003 | Yu et al. ....................... 385/18 |
| 2003/0122206 | A1 | 7/2003 | Bhattarai et al. |
| 2003/0179986 | A1* | 9/2003 | Martin et al. ................. 385/18 |

OTHER PUBLICATIONS

Statement by Applicants (including Attachment A).

M. Jenkins, et al., Chemical and Structural Characterization of Silane Adhesion Promoting Films for Use in Microelectronic Packaging, Materials Research Society. Symp. vol. 629, pp. FF5.12.1-FF5.12.6 (2000).

F. Niklaus, et al., "Low-Temperature Wafer-Level Transfer Bonding," Journal of Microelectromechanical Systems, vol. 10, No. 4, pp. 525-531 (Dec. 2001).

F. Niklaus, et al., "Void-Free Full Wafer Adhesive Bonding," Department of Signals, Sensors and Systems, Royal Institute of Technology, Stockholm, Sweden (date unknown) Applicants admit the status of this publication as prior art for the limited purpose of examination of this application, but otherwise reserve the right to challenge the status of this publication as prior art.

S.K. Sampath, et al., "Rapid MEMS Prototyping using SU-8, Wafer Bonding and Deep Reactive Ion Etching," IEEE (2001).

A. Jourdain, et al., "Investigation of the Hermeticity of BCB-Sealed Cavities for Housing (RF-)MEMS Devices," IEEE, pp. 677-680 (2002).

T-K. Chou et al., "3D MEMS Fabrication Using Low-Temperature Wafer Bonding with Benzocyclobutene (BCB)," The 11th International Conference on Solid-State Sensors and Actuators, Munch, Germany (Jun. 2001).

J. Neysmith et al., "A Modular, Chip Scale, Direct Chip Attach MEMS Package: Architecture and Processing," The International Journal of Microcircuits and Electronic Packaging, vol. 23, No. 4, pp. 474-480 (2000).

P.V. Dressendorfer, et al., "MEMS Packaging—Current Issues and Approaches," 2000 International Conference on High-Density Interconnect and System Packaging (2000).

Product literature entitled "Cyclotene™ 4000 Series Advanced Electronic Resins (Photo BCB)—Processing Procedures for Cyclotene 4000 Series (Photo BCB Resins DS2100 Puddle Develop Process," Cyclotene™ Advanced Electronic Resins, by Dow (revised May 3, 1999).

Product literature entitled "Cyclotene™ 4000 Series Advanced Electronic Resins (Photo BCB)—Processing Procedures for Cyclotene™ 4000 Series Photo BCB Resins—Immersion Develop Process," Cyclotene™ Advanced Electronic Resins, by Dow (revised Apr. 2, 2001).

Product literature entitled "Cure and Oxidation Measurements for Cyclotene Advanced Electronic Resins," Cyclotene™ Advanced Electronic Resins, by Dow (date unknown) Applicants admit the status of this publication as prior art for the limited purpose of examination of this application, but otherwise reserve the right to challenge the status of this publication as prior art.

G. Mittendorfer, et al., "Summary Study of BCB Coating Tests," by EVG (date unknown) Applicants admit the status of this publication as prior art for the limited purpose of examination of this application, but otherwise reserve the right to challenge the status of this publication as prior art.

"Tutorial 1—Introduction to Flip Chi;p: What, Why, How," web page by Flip Chips Dot Com (date of first publication unknown). Applicants admit the status of this publication as prior art for the limited purpose of examination of this application, but otherwise reserve the right to challenge the status of this publication as prior art.

S. Renard, "Wafer level Surface Mountable Chip Size Packaging for MEMS and ICs," Micromachined Devices and Components VI, Proceedings of SPIE, vol. 4176 (2000).

H.H. Gatzen, "Dicing challenges in microelectronics and micro electro-mechanical systems (MEMS)," Microsystem Technologies, 7, pp. 151-154 (2001).

H.H. Gatzen, et al., "Advances in Dicing Wafers for Micro Electro-Mechanical Systems (MEMS)," Proceedings vol. 2, Micro.tec 2000, Hanover Germany (Sep. 2000).

* cited by examiner

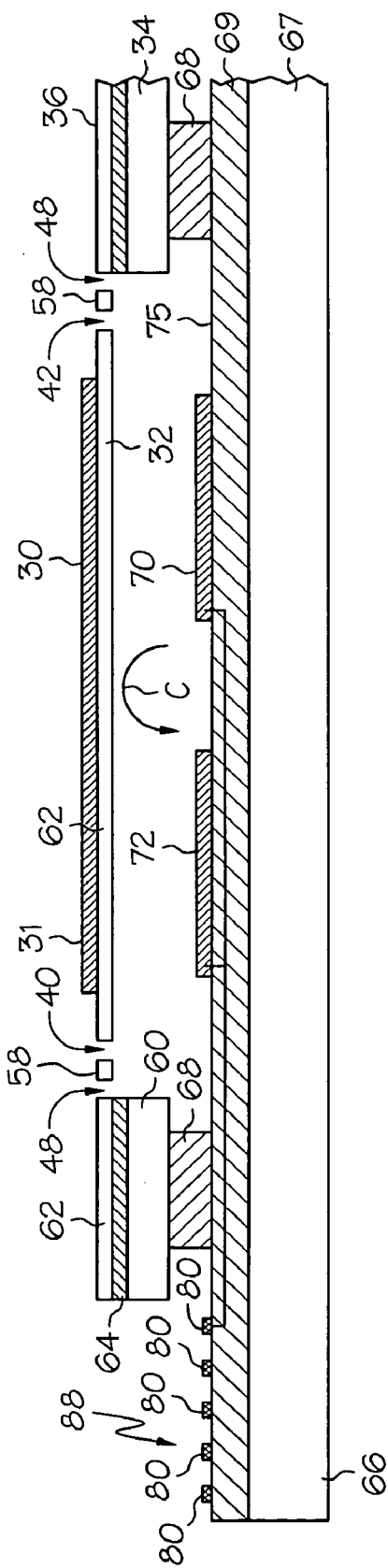
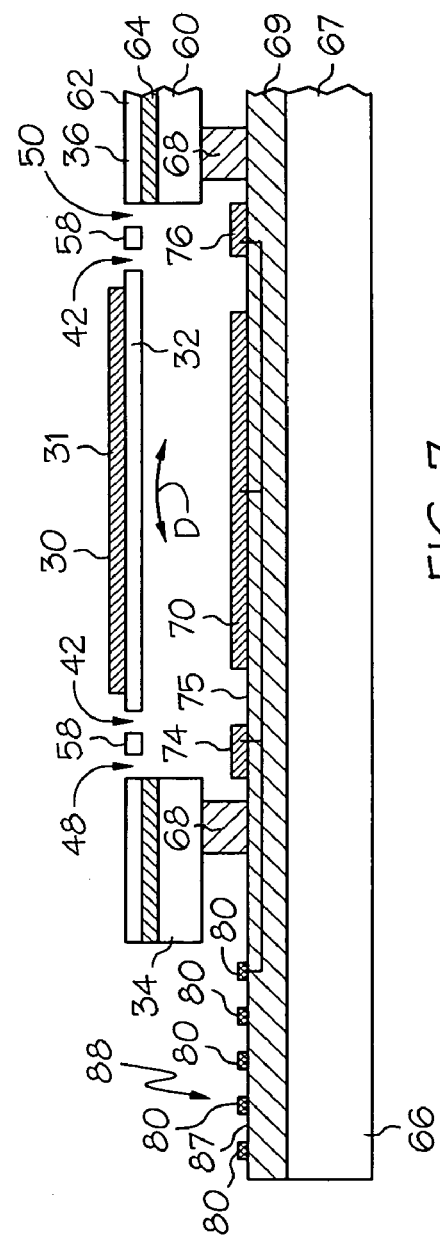
FIG. 6
FIG. 7

MICRO MIRROR ARRAYS AND MICROSTRUCTURES WITH SOLDERABLE CONNECTION SITES

BACKGROUND

The present invention is directed to a microstructure system or a mirror array, and more particularly, in one embodiment to an array of individually movable mirrors for use in an optical cross connect engine.

In fiber optic communication systems a plurality of optical fibers are used to transmit light signals in a well-known manner. In order to route the light signals to the desired destination, fiber optic communication systems may include a plurality of optical cross connect engines dispersed throughout the system. The optical cross connect engines may function as "junction boxes" to route the light signals between various optical fibers in the desired manner. The optical cross connect engines can include a plurality of mirrors and optical tools to route light signals between the various optical fibers. The mirror arrays typically are or include micro electro mechanical systems ("MEMS") formed by MEMS processing methods.

Most existing mirror arrays require electrodes and a relatively complex system of control electronics electrically coupled to the electrodes to control and coordinate the voltages that are applied to the electrodes, which in turn controls movement of the mirrors. In many existing optical cross connect engine MEMS systems, the control electronics may be located on a first wafer, wafer portion or die and the components to be controlled may be located on a second wafer, wafer portion or die. The first wafer can then be located adjacent to the second wafer, and connections between the first and second wafer can be completed via wire bonds so that the control electronics can control the components to be controlled. However, in this case, the control electronics must be coupled to the electrodes by a large number of wire bond connections, and is therefore time consuming and expensive to assemble. In addition, the parasitic effects of the large number of wire bonds can reduce the effectiveness of the device.

SUMMARY

In one embodiment, the present invention is a micro mirror array which includes an upper wafer, wafer portion or die and a lower wafer, wafer portion or die and a set of connection sites located on the lower die and outside of the coverage area of the upper die which can enable easy access to the connection site. In particular, in one embodiment the invention is a micro mirror array including an upper wafer portion having a plurality of movable reflective surfaces located thereon, the upper wafer portion defining a coverage area in top view. The array further includes a lower wafer portion located generally below and coupled to the upper wafer portion. The lower wafer portion includes at least one connection site located thereon, the at least one connection site being electrically or operatively coupled to at least one component which can control the movement of at least one of the reflective surfaces. The at least one connection site is not generally located within the coverage area of the upper wafer portion.

In another embodiment, the invention is a microstructure having a solderable surface. In particular, in one embodiment the invention is a microstructure system including a wafer portion including a microstructure formed therein, located thereon or supported thereby. The microstructure system also includes a solderable surface configured to receive an electronic component thereon in a direct attachment manner, the solderable surface being formed on, located on, or supported by the wafer portion. The solderable surface is electrically or operatively coupled to the microstructure such that an electronic component coupled to solderable surface can control, operate or receive inputs from at least part of the microstructure.

In another embodiment, the invention is a microstructure system including an upper wafer or wafer portion including a microstructure formed therein, located thereon or supported thereby, the upper wafer portion defining a coverage area in top view. The system further includes a lower wafer or wafer portion located generally below and coupled to the upper wafer or wafer portion. The lower wafer or wafer portion includes an electronic component located thereon or supported thereby, the electronic component being electrically or operatively coupled to the microstructure such that the electronic component can control, operate or receive inputs from at least part of the microstructure. The electronic component is generally not located within the coverage area of the upper wafer portion.

In yet another embodiment, the invention includes the use of an adhesive or photopatternable material to join wafers or portions of a microstructure together, or to electrically isolate portions of a wafer or microstructure.

Other objects and advantages of the present invention will be apparent from the following description and the accompanying drawings.

BRIEF DESCRIPTION OF THE DRAWINGS

FIG. 6 is a representative cross section taken along line 6—6 of FIG. 3;

FIG. 7 is a representative cross section taken along line 7—7 of FIG. 3;

DETAILED DESCRIPTION

Figure 1:
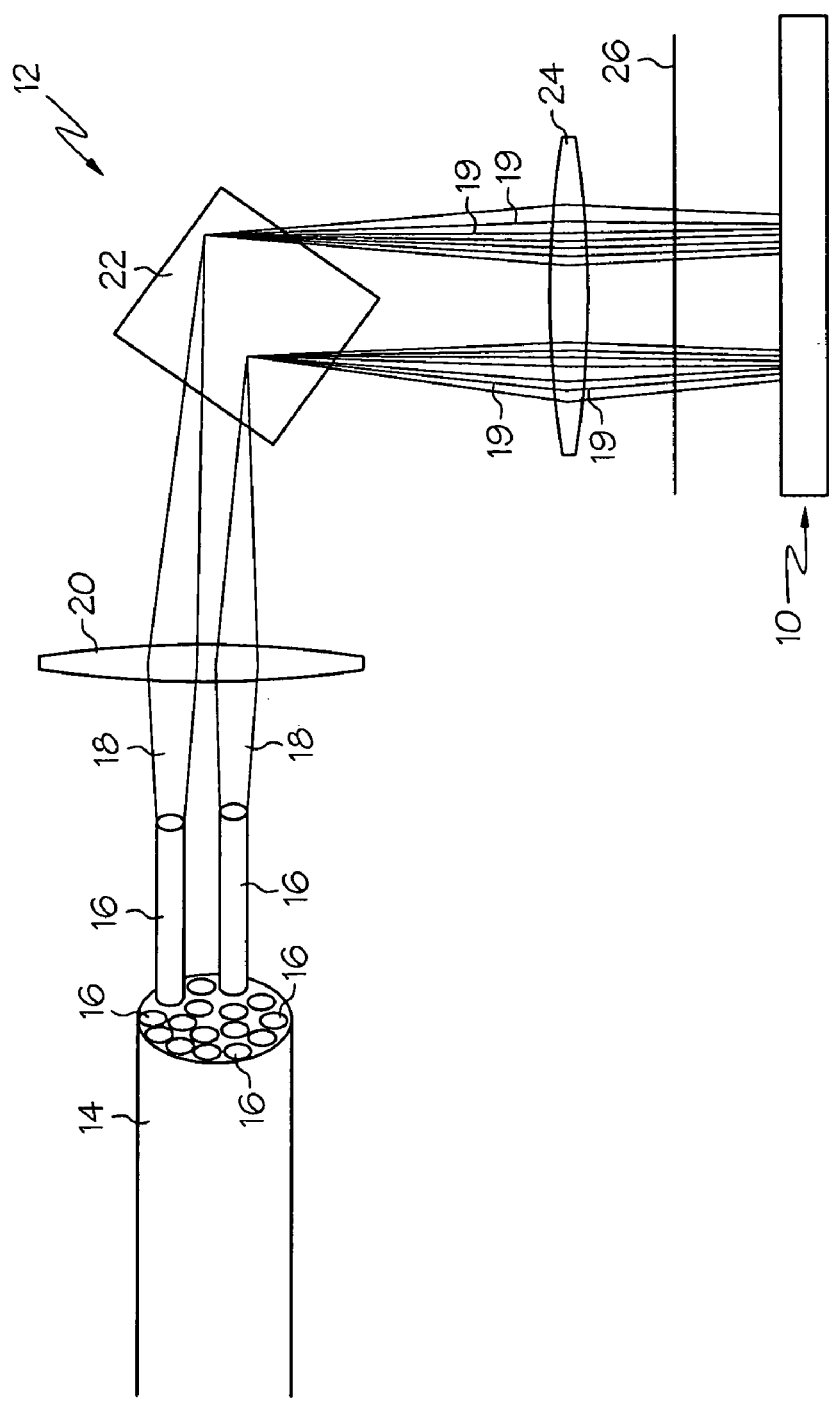
FIG. 1 is a schematic representation of an optical cross connect engine.

As shown in FIG. 1, the mirror array of the present invention, generally designated 10, can be used with or as part of an optical cross connection engine, such as a photonic or optical cross connection engine ("POXCE"), generally designated 12. A plurality of fiber optic cables 14 (only one of which is shown in FIG. 1) may be coupled to the optical cross connect engine 12. Each fiber optic cable 14 may include a plurality of individual optical fibers 16 encased therein. Each optical fiber 16 may carry or transport a light signal or beam 18.

In one embodiment, each beam 18 from each optical fiber 16 that is coupled to the optical cross connect engine 12 may be passed through a lens 20 that focuses each beam 18 upon a diffraction grating lens system 22. The grating lens system 22 can separate each beam 18 into a plurality of wavelength channel beams 19. Each wavelength channel beam 19 can represent a discreet wavelength that carries a signal, and each beam 18 and fiber 16 can typically carry a large number of discrete wavelength channel beams or signals, for example, up to 160 or more signals. The dispersed wavelength channel beams 19 may then be passed through a lens 24 and a quarter-wave plate 26 to compensate for the polarization sensitivity of the grating. However, the POXCE may utilize various methods and means for routing signals and beams, and need not necessarily include wavelength switching or other methods/components described above.

The wavelength channel beams 19 may then. reach the mirror array 10, also known as a micromechanical switching matrix. The mirror array 10 may include a plurality of movable mirrors or reflective surfaces such that the incoming signals 19 bounce off of the mirrors and are routed in the desired direction. The reflected signals. 19 can then be passed back through the quarter-wave plate 26, lens 24, diffraction grating lens system 22 and lens 20, and may then be routed to the desired optical fiber 16 for further transportation.

In this manner the mirror array 10 can redirect light signals from a departure optic fiber to a destination optic fiber. The departure optic fiber may be the same as the destination optic fiber (FIG. 1), or they may be different (not shown in FIG. 1). Furthermore, the departure optic fiber may be in the same cable 14 as, or in a different cable from, the destination optic fiber. In other words, signals. can be routed from any optic fiber connected to the cross connect engine to any optic fiber connected to the cross connect engine.

Figure 2:
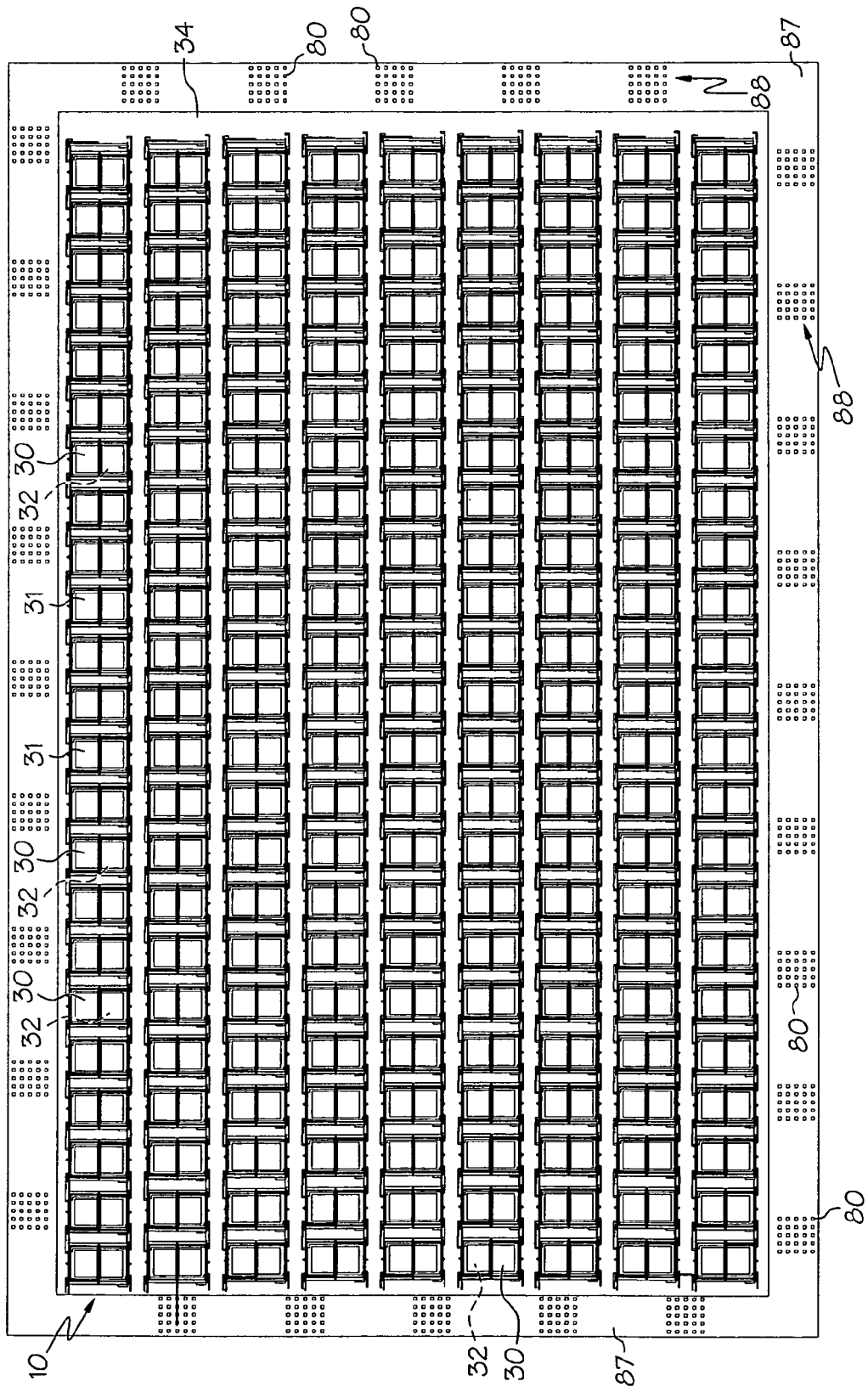
FIG. 2 is a top plan view of one embodiment of the mirror array of the present invention.

As shown in FIG. 2, the mirror array 10 may include a plurality of movable mirrors 30 formed in an array, with each mirror 30 including a reflective surface 31 located on an associated movable portion 32. The reflective surfaces 31 can be made from nearly any material that reflects the light signals to be transmitted (which can be infrared light). The reflective surfaces 31 can be made of a metal, such as gold. However, nearly any metal or material which can reflect the desired wavelength of energy may be used as the reflective material 31. The reflective material 31 may have a reflectivity of greater than about 95% at infrared wavelengths, and it has been found that gold is an appropriate material that may be used to reflect infrared radiation.

Each of the mirrors 30 may be relatively small (i.e., in one embodiment on the order of about 20 microns×20 microns), and the array 10 can include nearly any desired number of mirrors 30 (i.e., in one embodiment about 500 mirrors). Each movable portion 32 may be able to be rotated to move its associated reflective surface 31 into the desired configuration to reflect light signals in the desired manner.

Figure 4:
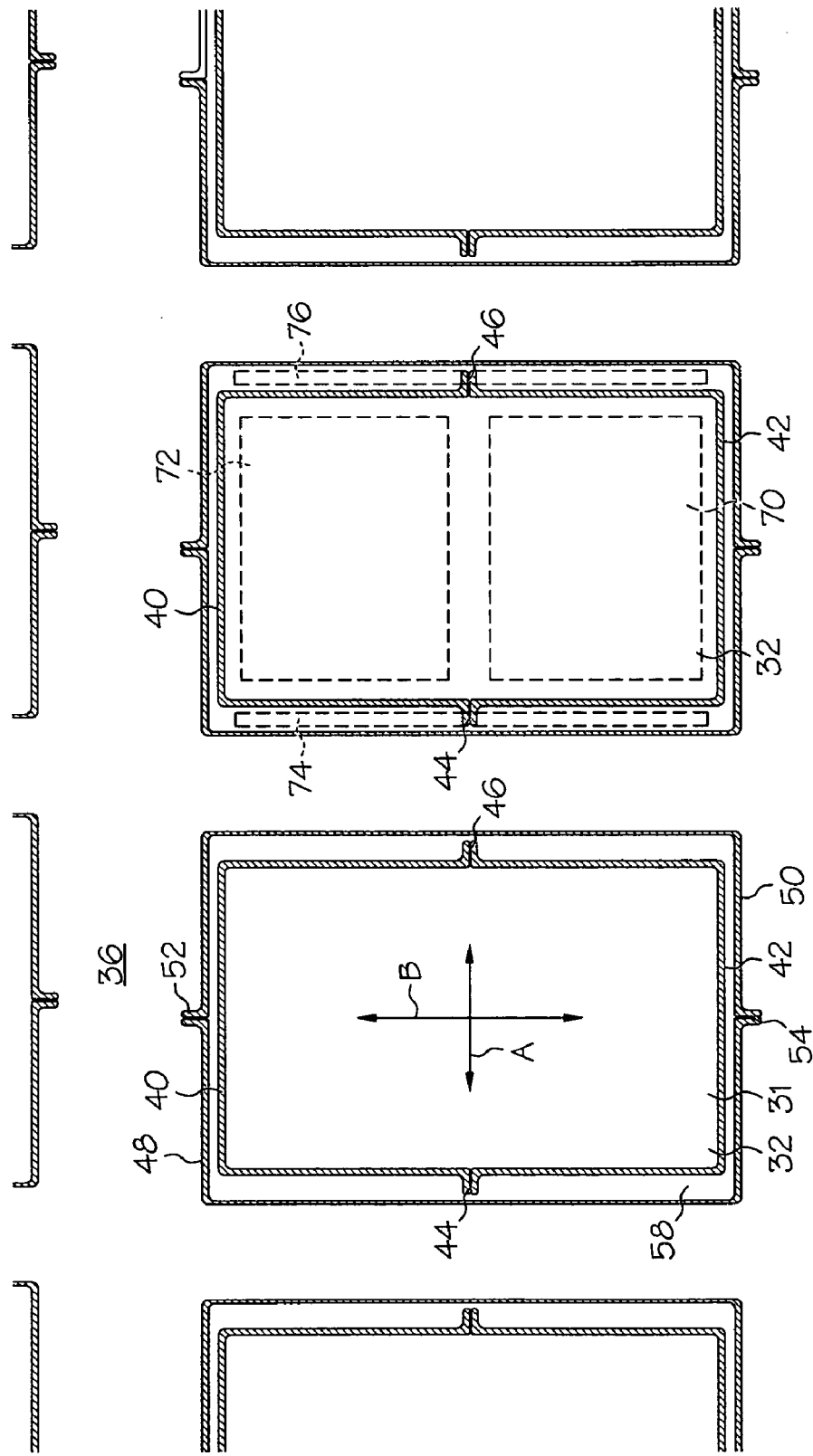
FIG. 4 is a top view of selected upper components of the mirror array of FIG. 3.
Figure 5:
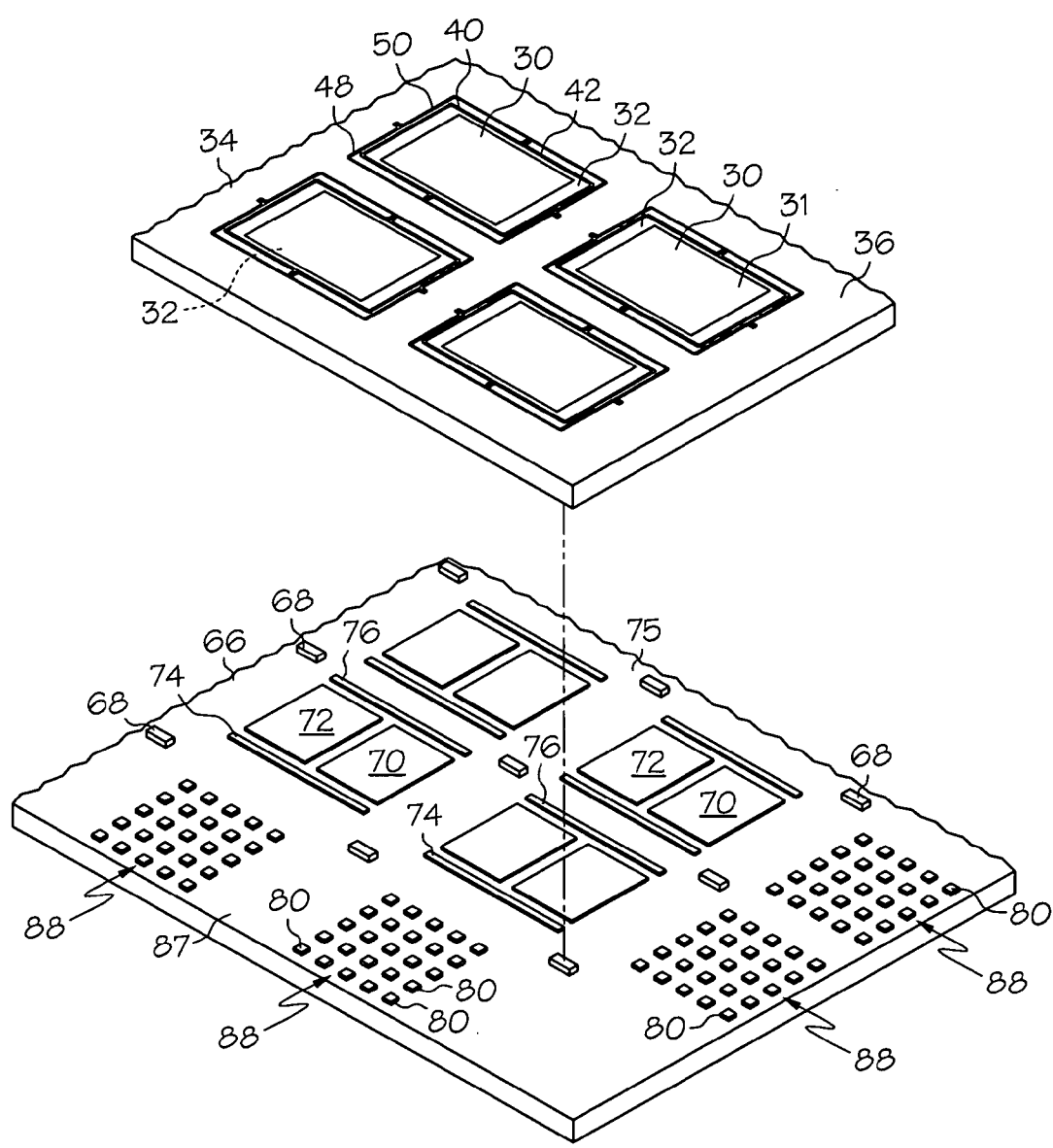
FIG. 5 is a perspective exploded view of the portion of the mirror array of FIG. 3.

As shown in greater detail in FIGS. 5–7, the mirrors 30 may be located on an upper wafer 34. The upper wafer 34 may include or be made up of two separate wafers or wafer portions which are joined together to form the upper wafer 34. The upper wafer 34 may thus be a silicon-on-insulator wafer, and/or be made of or include silicon-on-insulator wafers. The upper wafer 34 may include a base portion 36, and each of the movable portions 32 may be movably coupled to the base portion 36. As shown in FIG. 4, each movable portion 32 may be defined by a set of cut outs or recesses 40, 42, 48, 50 formed in, and extending through the thickness of, the upper wafer 34. For example, the inner cut outs 40, 42 may extend generally around the outer periphery of each movable portion 32. The ends of the inner cut outs 40, 42 may be slightly spaced apart to define a pair of narrow inner arms 44, 46 located on opposite sides of the associated movable portion 32. In this manner, the portion of the upper wafer 34 located inside the inner cut outs 40, 42 may be rotatable about an axis A defined by the inner arms 44, 46.

The upper wafer 34 may also include a set of outer cut outs 48, 50 that extend generally around the outer periphery of each movable portion 32. The ends of the outer cut outs 48, 50 may be spaced apart to define a pair of outer arms 52, 54 located on opposite sides of the associated movable portion 32. Each movable portion 28 may thus include an intermediate surface 58 located between the inner 40, 42 and outer 48, 50 cut outs. In this manner, the portions of the upper wafer 34 located inside of the outer cut outs 48, 50 (including the intermediate surface 58) may be rotatable about an axis B defined by the outer arms 52, 54. Thus the inner 40, 42 and outer 48, 50 cut outs and inner 44, 46 and outer 52, 54 arms define movable portions 32 that may double gimbaled, or independently pivotal, about both axes A and B. Of course, various other structures and assemblies for pivotally and/or movable mounting mirrors 30, as well as various other biasing and spring mechanisms may also be used.

As shown in FIGS. 6 and 7, the upper wafer 34 may be a silicon-on-insulator wafer which may include a lower silicon layer or support layer 60, an upper silicon layer 62, and an insulating layer 64 (such as silicon dioxide) located between the upper 60 and lower 62 silicon layers. The lower layer 60 may have a thickness of about 100 microns, and the upper layer 62 may have a thickness of about 10 microns (the relative thicknesses of the various layers are not necessarily shown in scale in the accompanying drawings). The insulating layer 64 (as well as the other insulating/passivation layers discussed herein) may be a silicon dioxide layer having a thickness of about 1 micron, but could also be nearly any insulating or dielectric layer of any desired thickness. Of course, the thickness and materials of the layers 60, 62, 64 can be varied as desired to meet the requirements of the array 10 or other microstructure.

The lower layer 60 and upper layer 62, and in particular the upper layer 62, may be made of doped silicon or other semiconductor material such that the upper layer 62 has a relatively high electrical conductivity. However, the lower layer 60 and upper layer 62 can also be made from a variety of other materials besides silicon, such as amorphous silicon, polysilicon, silicon carbide, germanium, polyimide, ceramics, nitride, sapphire, silicon nitride, glasses, semiconductor material, a combination of these materials or nearly any other machinable or micromachinable material. In any case, because the movable portions 32 are formed in the upper layer 62, the upper layer 62 may be electrically conductive or have an electrically conductive material located thereon such that the movable portion 32 can be moved by electrical or electrostatic forces, as will be discussed in greater detail below.

The upper layer 62 may have the desired thickness of the movable portions 32 and associated arms 44, 46, 52, 54. More particularly, the cut outs 40, 42, 48, 50 may be formed in or through the upper layer 62 to form the intermediate portion 58 and inner arms 44, 46 and outer arms 52, 54.

The upper wafer 34 may be coupled to a lower wafer 66 that is located below the upper wafer 34. The lower wafer 66 may be a silicon-on-insulator wafer having a silicon layer 67 and an insulating layer 69. The lower wafer 66 may include or be made up of two separate wafers or wafer portions which are joined together to form the lower wafer 66. The lower wafer 66 can also be a standard silicon wafer, or can be made of a variety of semiconducting materials beyond silicon, such as GaAs or InP, as well as the materials listed above for the upper wafer 34, or can also be or include a glass or ceramic substrate, or a printed circuit board.

The upper wafer 34 and lower wafer 66 can be coupled together by a variety of methods and structures, including but not limited to benzocyclobutene (BCB) bonding (which will be discussed in greater detail below). The bond between the upper 34 and lower 66 wafers may be desired to be electrically insulating. Further, because elevated temperatures can damage certain components of the mirror array 10, it may be desirable to use relatively low temperature bonding or other coupling procedures for coupling the upper 34 and lower 66 wafers. For example, it may be desired to use adhesive or coupling medium having a reflow temperature of less than about 125° C., or to use a coupling procedure which takes place at a temperature less than about 125° C.

As shown in FIGS. 3, 5–7 and 9–11, the mirror array 10 may include a plurality of posts 68 that extend between the lower wafer 66 and upper wafer 34 and that may consist of bonding materials. However, a wide variety of other structures may extend between the upper 34 and lower 66 wafers in order to couple the wafers together, including portions of the upper 34 or lower 66 wafers themselves.

Figure 3:
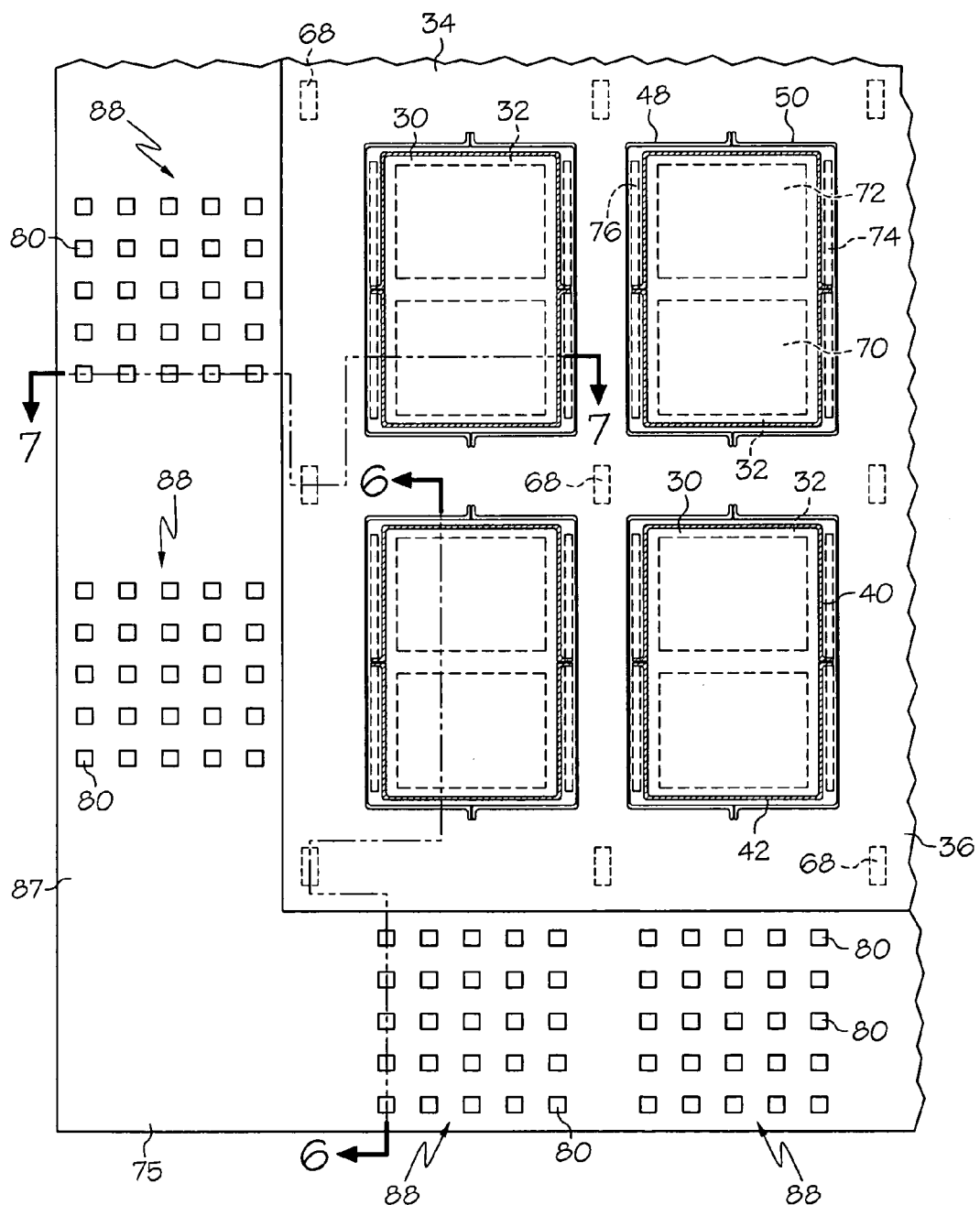
FIG. 3 is a detail view of a portion of the mirror array of FIG. 2.

The lower wafer 66 may include a plurality of electrodes or conductive surfaces 70, 72, 74, 76 located on an upper surface 75 of the lower wafer 66. The electrodes 70, 72, 74, 76 can be activated (such as by applying a voltage to the electrodes or a voltage across the electrodes and the mirrors 30, reflective surfaces 31 and/or movable portions 32) to control movement of the movable portions 32 and associated reflective surfaces 31. As shown in FIGS. 3–5, each mirror 30 may have an associated set of electrodes 70, 72, 74, 76 located below each mirror 30. The set of electrodes can include a pair of actuating electrodes 70, 72 and a pair of adjustment electrodes 74, 76. The lower wafer 66 may include a protective coating (not shown) such as an oxide or other passivation layer located on the lower surface 75, and in particular over the electrodes 70, 72, 74, 76 to protect the electrodes 70, 72, 74, 76 and prevent/limit oxidation thereof.

The mirror array 10 may include a plurality of solderable surfaces 88, or electrical connection sites 88, or flip chip connection sites 88, located around the perimeter of the array of mirrors 30. The flip chip connection sites 88 may be located on the lower wafer 66, and each of the flip chip connection sites 88 may include a plurality of pads 80 of conductive material. The pads 80 may be made of any desired material and formed by any of a wide variety of manufacturing methods. For example, the pads 80 can be a eutectic alloy or other metal (such as solder, gold, or other metals), or other conductive materials, and can be formed, created or manufactured by evaporation, electroplating, screen printing, needle depositing, electroless plating, adhesive, or direct deposition. Each pad 80 may be made of a material or materials which are solderable surfaces; that is, surfaces which can be electrically or operatively coupled to another component or surface by solder connections. In one embodiment, each pad 80 may include gold as the top-most layer, with the gold being located on a nickel layer, and the nickel layer being located on a titanium layer. The titanium layer may be located on an aluminum pad or other layer. However, each pad 80 can be made from a wide variety of materials to form solderable surfaces.

The pads 80 may be formed to accommodate solder bump flip chips, plated bump flip chips, stud bump flip chips, adhesive bump flip chips, or other types of flip chips. Due to the materials of the pads 80 and flip chip bonding sites 88, the pads 80 and flip chip bonding sites 88 may be made of materials having a relatively low melting temperature, such as, for example, less than about 250° C., or less than about 300° C., or less than about 400° C. Thus, in subsequent processing steps care should be taken to not exceed the melting point of the pads 80 and flip chip bonding sites 88.

In the illustrated embodiment twenty-five pads 80 are arranged in a 5×5 array to form a connection site 88. As schematically shown in FIGS. 6 and 7, at least one of the pads 80, or each of the pads 80, may be electrically or operatively coupled to at least one of the electrodes 70, 72, 74, 76 to control the actuation of the electrodes 70, 72, 74, 76, and each pad 80 may be electrically isolated from any adjacent pads 80.

Figure 8:
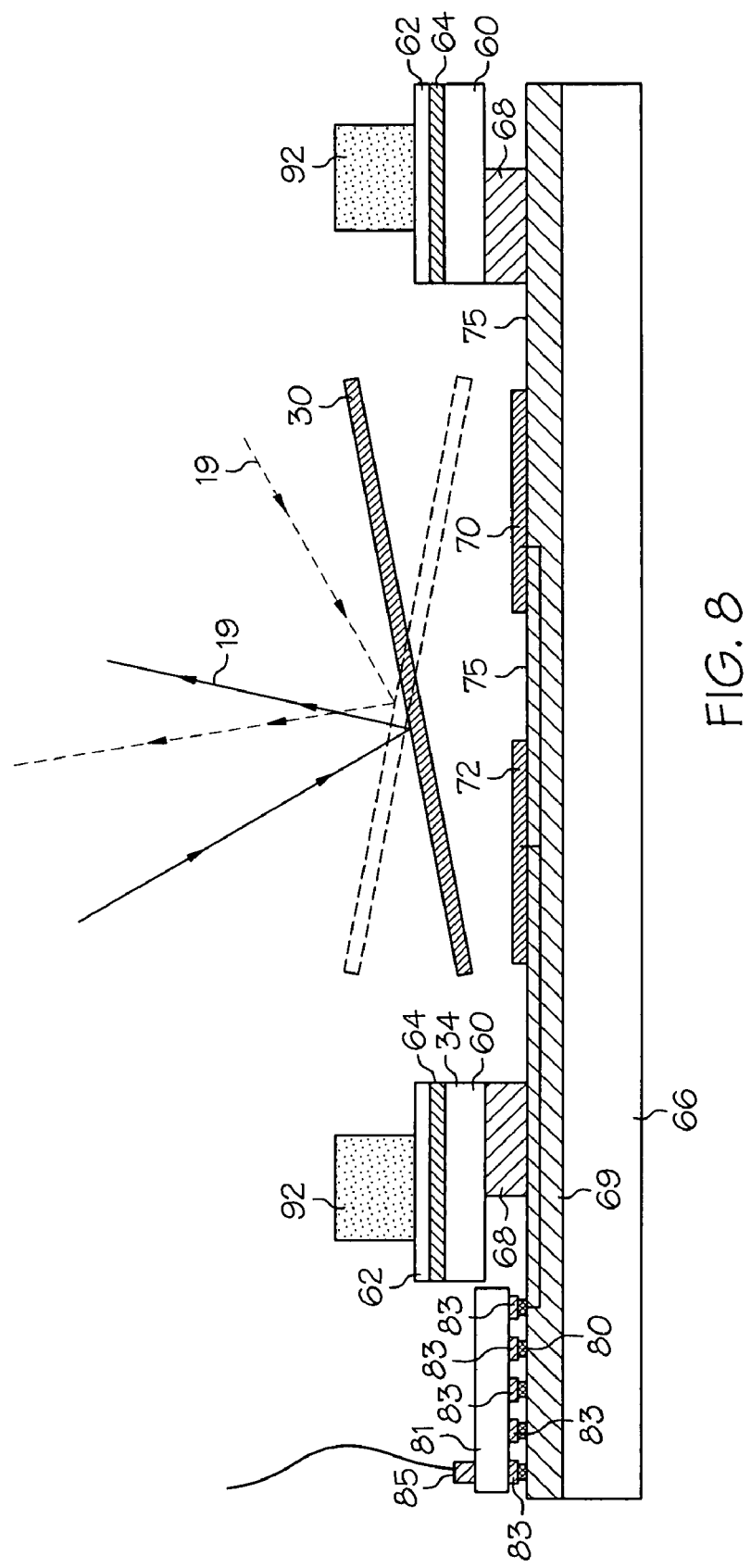
FIG. 8 is a schematic representation of a mirror of one embodiment of the mirror array of the present invention, illustrated in various rotational positions.

The pads 80 and connection sites 88 may be arranged to be electrically or operatively coupled to a chip 81 or other electronic component that is located on and supported by the lower wafer 66. For example, each connection site 88 may be able to accept. a chip 81 thereon by flip chip bonding or flip chip coupling (also known as direct chip attach) which involves placing a chip, having electrical contacts, directly onto the flip chip connection sites 80 so that the contacts of the chip are electrically and/or operatively coupled to the pads 80 in a well known manner. For example as shown in FIG. 8, a chip 81 having a plurality of output bumps or contacts 83 is located on top of and coupled to the connection site 88, pads 80 and/or lower wafer 66. The chip 81 is then coupled to the connection site 88 (such as by soldering, conductive adhesive, etc.) to electrically connect the chip 81 to the connection site 88. The pads 80 may thus be arranged in the same pattern of the output contacts 83 to ensure that the connection sites 88 are shaped to properly receive a chip 81 thereon. Thus, although the illustrated embodiment shows the connection sites 88 as including a square 5×5 array of pads 80, the pads 80 may be sized, shaped and arranged in nearly any manner to accommodate the size, shape and arrangement of output contacts 83 of the flip chip 81 desired to be used with the array 10.

The chip 81 may be any electronic component, including a processor, electronics, memory, circuitry, ASIC, processor, controller, logic chip, or the like, and may include a plurality of transistors, such as CMOS transistors (not shown). The chip 81 may provide the logic circuitry for controlling the application of voltages to the electrodes 70, 72, 74, 76. Of course, the chip 81 may include nearly any electronic component(s) that can provide the logic and routing circuitry for directing the desired voltages to the electrodes 70, 72, 74, 76 in the desired manner. However, CMOS transistors may be preferred as the logic circuitry and as a high voltage driver because CMOS transistors use relatively low amounts of power and generate relatively little heat. The CMOS transistors or other logic circuitry may be coupled together in a multiplexed fashion.

Alternately, or in addition, the chip 81 may include an external connection location 85 to enable the chip 81 to be connected to an external processor, printed circuit board, controller, computer, CPU or the like, for example, via a wire bond, ribbon, or other connection method. For example, in one case the chip 81 may be coupled to a PCB with wirebonds, and the PCB may be coupled to a processor, controller or computer with a ribbon cable. Further, although FIG. 8 illustrates only a single chip 81, additional ones of the connection sites 88, or all of the connection sites 88 of the array 10, may include a chip 81 located thereon, and each of the chips 81 may be coupled to external processor, controller, computer, CPU or the like. Each chip 81 may be electrically connected or coupled to electrodes 70, 72, 74, 76 for selected ones of the mirrors 30, or be electrically connected or coupled to electrodes 70, 72, 74, 76 for selected rows and/or columns of the mirrors 30. Each chip 81 may also be electrically connected or coupled to the mirrors 30 (i.e. to the reflective surfaces 31) so that a voltage differential between the electrodes 70, 72, 74, 76 and the mirrors 30 can be maintained and controlled. The mirrors 30 (i.e. the reflective surfaces 31) may instead be grounded so that the voltage differential between the electrodes 70, 72, 74, 76 can be precisely known.

As can be seen in FIG. 2, in the illustrated embodiment, in top view the upper wafer 34 is generally rectangular and is located within the perimeter of the generally rectangular lower wafer 66. In other words, the upper wafer 34 is located within or contained within the "coverage area" or "footprint" of the lower wafer 66 in top view. Thus, in this case the lower wafer 66 includes an "underhang" portion 87 protruding outwardly relative to the upper wafer 34, or not covered by or located under the upper wafer 34.

Each of the connection sites 88 may be located on the underhang portion 87 to ensure that the connection sites 88 can be easily accessed to enable a chip 81 to be easily coupled to each connection site 88. In this manner, each connection site 88, as well as each chip 81, may be located outside the coverage area or footprint of the upper wafer 34. Further, the footprint of the lower wafer 66 need not necessarily be larger than the footprint of the upper wafer 34. Instead, all that is required is that the lower wafer 66 have a surface upon which a connection site 88 can be located, wherein that surface is not covered by or located below the upper wafer 34. Thus, the underhang portion 87 provides a surface upon which a chip 81 can be easily coupled.

For example, the coverage area or footprint of the upper wafer 34 may be viewed as the shadow cast by the upper wafer 34 by a light source located directly above the upper wafer 34. Thus, the portions of the lower wafer 66 which are not located directly below a portion of the upper wafer 34 may be considered to be outside the coverage area of the upper wafer, even if those portions of the lower wafer 66 are located away from the outer perimeter of the upper wafer 66 (i.e. are located below an opening formed in the upper wafer 34) or adjacent to irregular outer edges of the upper wafer 34.

By providing the connection sites 88 which can receives chips 81 thereon, the entire array 10 can be manufactured without having any chips or complex electronics located on the array 10, which can be suspect to damage during manufacturing. After the array 10 is manufactured, or even after the array 10 is shipped to a customer, the chips 81 may then be coupled to the connection sites 88 as a final assembly step. Furthermore, the manufacturing of the mirrors 30 and the body of the array 10 can be manufactured separately from the electronics or chips 81. Thus, through this "modular" manufacturing, unacceptable arrays 10 and chips 81 can be discarded before assembly, thereby improving the yield of the end product. The use of a chip 81 and flip chip manufacturing also reduces the need for wire bonding and improves efficiency of manufacturing and the robustness of the array 10, and may reduce parasitic effects and improve transmission speed.

In order to operate the mirror array 10 of FIGS. 2–7, a processor, controller, computer or CPU or the like is connected to all or selected ones of the chips 81. The controller can then provide signals to the chips 81 which are processed and analyzed by the chips 81 to determine how to apply various voltages in the desired manner to the desired electrodes 70, 72, 74, 76. Further, a specific mirror or mirrors, or mirror address(es) may be provided from the controller for actuation.

For example, as best shown in FIG. 6, in order to rotate the mirror 30 shown therein, a positive or negative AC or DC voltage may be applied to the actuating electrode 72 (i.e. across the electrode 72 and the associated mirror 30). The amount of voltage applied to the electrode 72 can be any amount of voltage to achieve the desired rotation, for example, in one case about 200 volts. The mirror 30 and/or reflective surface 31 and/or movable portion 32 may be grounded by, for example, grounding each mirror to the bulk of the upper wafer 34. The voltages in the actuating electrode 72 creates an electrostatic force that causes the conductive movable portion 32 to rotate in the direction of arrow C (i.e., about axis A and about inner arms 44, 46 (see FIGS. 4 and 8)). As the movable portion is rotated or tilted, the reflective surface 31 located thereon is also thereby tilted to the desired configuration. The degree of rotation of the movable portion 32 can be controlled by the voltages applied to the electrode 72. In this manner each mirror 30 can be rotated to the desired inclination to reflect an incoming light signal in the desired direction.

When the movable portion 32 and reflective surface 31 are rotated about axis A, the inner arms 44, 46 are twisted or placed in a state of tension/compression. Thus, when the voltage applied to the actuating electrode 72 is removed or sufficiently reduced, the movable portion 32 and mirror 30 may rotate in the direction opposite to arrow C to return the movable portion 32 to its neutral position shown in FIG. 6. In this manner, the spring force of the inner arms 44, 46 returns the movable portion 32 and mirror 30 to their neutral position. Thus, the forces applied by the electric field of the actuating electrode 72 must overcome the spring force of the arms 44, 46 in order to cause rotation of the associated movable portion 32. The movable portion 32 can be moved in the direction opposite to arrow C by applying a voltage to electrode 70 while the mirror 30 is grounded.

The adjustment electrodes 74, 76 can be used to provide another degree of freedom to the movable portion 32. In other words, a voltage can be applied to the adjustment electrodes 74, 76 to set up an electrical field that can cause the movable portion to rotate about the outer arms 52, 54 (about axis B of FIG. 4) and in the directions of arrow D (FIG. 7).

In this manner, the external controller and/or the chips 81 can execute control over each set of electrodes 70, 72, 74, 76 associated with each movable portion 32 and mirror 30 to simultaneously control the movement of each mirror 30. The array 10 can thereby be controlled by the controller and/or chips 81 to reflect a large number of beams of light signals to carry out the switching function of the mirror array 10. As noted above, the mirrors 30 may be grounded so that the voltage differential between the electrodes 70, 72 and the mirrors 30 can be precisely controlled.

Figure 9:
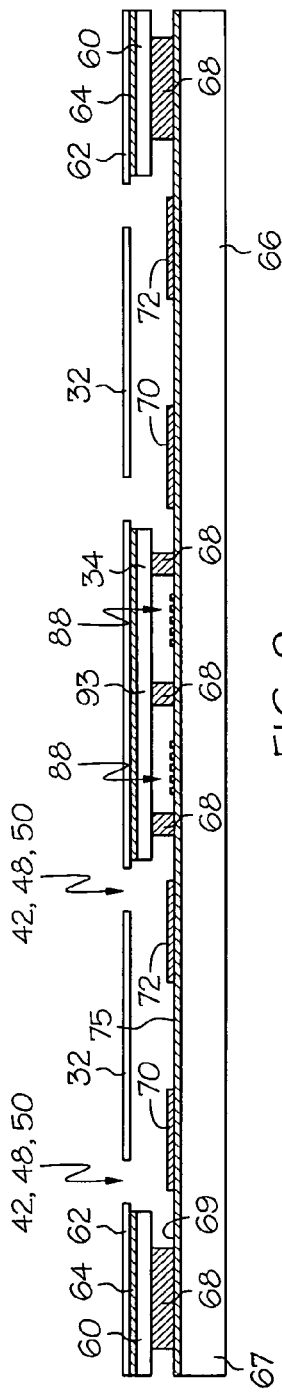
FIGS. 9–11 are a series of side cross sections illustrating a series of steps that may be used to form/singulate a mirror array.
Figure 10:
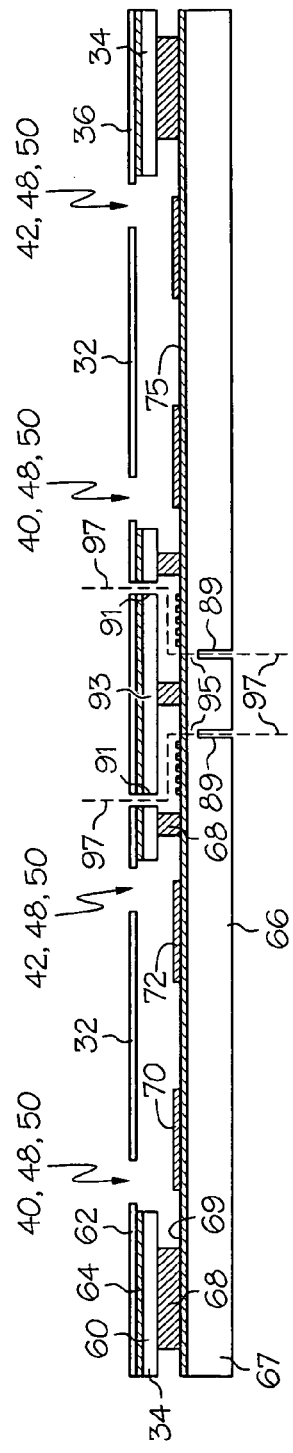
Figure 11:
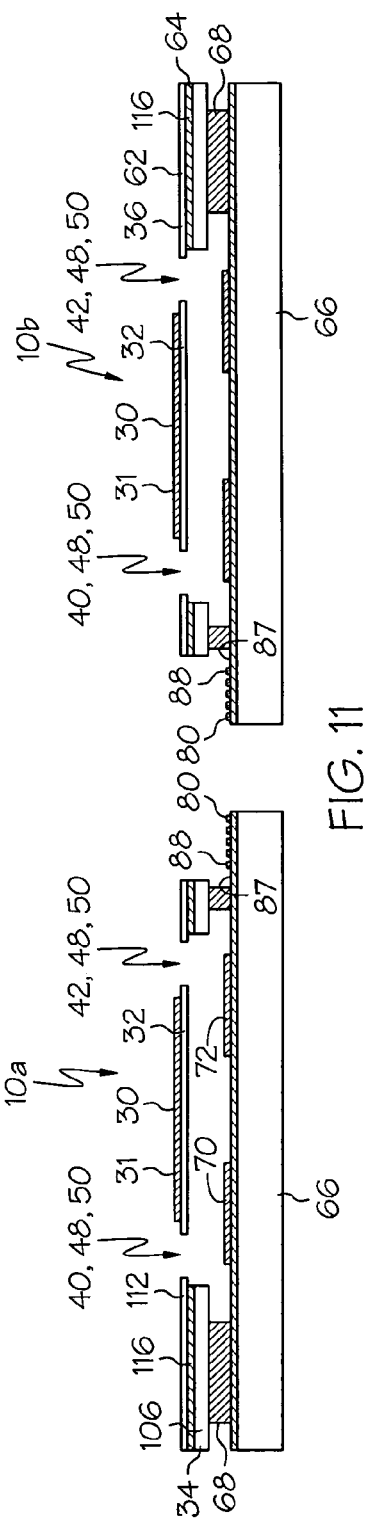

FIGS. 9–11 illustrate a method for forming/singulating the mirror array 10 of FIGS. 2–8, although various other methods of forming the mirror array 10 may be used without departing from the scope of the invention. The array 10 may be batch processed such that a plurality of movable portions, reflective surfaces, mirrors, electrodes, control electronics and the like are simultaneously formed on a wafer or wafers. However, for ease of illustration, FIGS. 9–11 illustrate only two adjacent mirrors and the associated components being formed. Further, FIGS. 9–11 are representative cross-sections which are intended to illustrate various features of the manufacturing process, and may not identically represent a cross-section of the device.

FIG. 11 illustrates two adjacent mirrors 30. However, it should be understood that each mirror 30 shown in FIG. 11 may be only a single mirror in an array of mirrors. For example, the left-hand mirror 30 shown in FIGS. 11 may be only a single mirror 30 of a larger array 10a and the right-hand mirror 30 may be only a single mirror in a larger array 10b.

The process may begin by providing/forming an upper wafer 34 which can include a plurality of inner arms 44, 46, outer arms 52, 54, base portions 36, movable portions 32, cut outs 40, 42, 48, 50, etc. The inner arms 44, 46, outer arms 52, 54, base portions 36, movable portions 32, cut outs 40, 42, 48, 50 can be formed by various processes and methods, including deep reactive ion etching ("DRIE") through upper wafer 34 or the upper layer 62 of the upper wafer 34. The movable portions 32 may or may not include the reflective material 30 located thereon. The upper wafer 34 may be processed to various stages of completion, and in the illustrated embodiment the upper wafer 34 is nearly completely processed except for the addition of the reflective material 30.

A lower wafer 66 may then be provided. The lower wafer 66 may also include the metallization portions located thereon, such as a plurality of electrodes 70, 72, 74, 76, pads 80 and bonding sites 88. The pads 80 and bonding sites 88 may be formed on what will ultimately form the underhang portions 87.

The upper wafer 34 may then be bonded or coupled to the lower wafer 66. Any of a wide variety of methods for attaching the upper 34 and lower 66 wafers may be used. However, it may be preferred that the upper 34 and lower 66 wafers be coupled at a relatively low temperature, such as, for example, temperatures less than about 250° C. to protect the solderable surfaces, such as the bonding sites 88 and pads 80. Low temperature bonding can also reduce the stress effects caused by materials having differing coefficients of thermal expansion, reduce the diffusive migration and oxidation of materials, and provide a process which is easier to control and implement. The bonding or coupling process may take place at a temperature below the melting or reflow temperature of the metallization of the lower wafer 66, such as the pads 80 and flip chip connection sites.88. For example, a bonding or coupling process which can take place at temperatures below 400° C., or below 300° C., or below 250° C. may be used to couple the upper wafer 34 and lower wafer 66.

In one embodiment, the upper 34 and lower 66 wafer are coupled by a BCB bonding process, which is discussed in detail below and shown in FIGS. 12–14. The BCB or other suitable bonding processes may protect the metallization of the lower wafer 66, which may have a melting or reflow temperature of around or below 250° C., 300° C. or 400° C. As noted above, it should be appreciated that the upper 34 and lower 66 wafers may be processed to various stages of completion prior to their bonding or coupling, and further processing of the upper 34 and lower 66 wafers after bonding or coupling may be required to produce the upper 34 and lower 66 wafers in their states shown in FIG. 9.

After the assembly of FIG. 9 is provided, a pair of upper singulation etches or cavities 91 may be formed through the thickness of the upper wafer 34, and the lower wafer 66 may then be etched to include a pair of lower singulation cavities 89, or partial etches, formed through a portion of the thickness of the silicon layer 67. Either or both of he upper singulation cavities 91 and lower singulation cavities 89 may also be formed prior to coupling the upper wafer 34 and lower wafer 66 together. The cavities 89, 91 may be formed by DRIE or other suitable etching methods. In the illustrated embodiment the lower singulation cavities 89 do not extend entire through the thickness of the lower wafer 66, but may extend more than one half the thickness of the silicon layer 67, such as, for example, about ⅔ through the thickness of the silicon layer 67 to leave a relative thin tab 95 above the singulation cavities 89. However, both or either of the singulation cavities 89, 91 may extend completely or partially through the associated wafer.

The singulation cavities 89, 91 may be formed in or adjacent to a body portion 93 located between two separate arrays 10a, 10b which are desired to be singulated (i.e. separated or divided). A plurality of singulation cavities 89, 91 beyond those shown in FIG. 10 may be formed or etched wherever the wafers 34, 66 are desired to be singulated or separated into sub-wafers or wafer portions Each of the cavities 89, 91 may extend generally vertically, or generally perpendicular to the arrays 10a, 10b, or generally perpendicular to the wafers 34, 66. The upper singulation cavities 91 may be laterally offset from (i.e. not vertically aligned with) the lower singulation cavities 89. For example, each upper singulation cavity 91 may be located closer to the associated, adjacent mirror 30 or array 10a, 10b than the associated lower singulation cavity 89. In other words, the left hand upper singulation cavity 91 may be located closer to the left hand mirror 30 or movable portion 32 of FIG. 10 than the left hand lower singulation cavity 89, and the right hand upper singulation cavity 91 may be located closer to the right hand mirror 30 or movable portion 32 than the right hand lower singulation cavity 89. As will be discussed below, the offset nature of the singulation cavities 89, 91 enable the adjacent arrays 10a, 10b to have the underhang portion 87 upon which the bonding sites 88 and chip 81 can be located.

As shown in FIG. 11, if not previously deposited the reflective material 31, such as gold or another metal, may then be deposited on the movable portions 32 to form the mirrors 30 thereon. The reflective material may be deposited by sputtering a metal through a shadow mask and onto the movable portion 32, or by any other acceptable process.

The tabs 95 may then be broken to separate the adjacent arrays (10a and 10b) from each other, and the body portion 93 located between the arrays 10a, 10b can be discarded. The offset nature of the cavities 89, 91 enables each lower wafer 66 to have a larger footprint than the upper wafer 34 to provide the underhang portions 87. In other words, each of the arrays 10a, 10b is singulated along a dividing line 97 (FIG. 10) which includes two offset, generally vertically extending portions (defined at least partially by the cavities 89, 91)

A wide variety of configurations of the dividing lines 97 and upper cavities 91 and lower cavities 89 may be used. For example, the tab 95 can be located at nearly any location throughout the thickness of the of the upper 34 or lower 66 wafers and need not necessarily be located above the lower singulation cavity 89. Further, instead of having two spaced lower cavities 89, only a single lower cavity 89 may be used.

Next, if desired, a cap (not shown) may be coupled to and located over each array 10a, 10b to protect the mirrors 30. A chip or chips 81 can then be coupled to the bonding sites 88. Each chip 81 may then be coupled to the associated bonding site 88, such as by flip chip bonding or other coupling processes, and the chip 81 and/or bonding sites 88 may be under filled in a well-known manner. Each array 10a, 10b can then be located in or formed as part of an optical cross-connect engine.

Although FIGS. 9–11 illustrate a process for coupling upper 34 and lower 66 wafers together to form a micro mirror array, it should be understood that the singulation process described herein, which may be implement using offset cavities or etching, can be utilized to singulate nearly any desired micromachine, micro device, microelectromechanical structure, and the like.

As can be seen from the manufacturing process as described above, the lower wafer 66 and upper wafer 34 may each be at least partially premanufactured and tested before they are joined together. Further, the chips 81 can be manufactured or acquired separately. This modular manufacturing provides greater flexibility in manufacturing the mirror array 10 and raises the overall yield of the arrays 10. For example, a number of upper 34 and lower 66 wafers can be premanufactured and tested according to varying specifications, and the premanufactured and approved upper 34 and lower 66 wafers can then be stored. A number of chips 81 having varying specifications can also be manufactured or acquired and tested. When an order for an array 10 is received from a customer, the upper 34 and lower 66 wafers and chips 81 that correspond to the parameters of the desired array can then be obtained, joined together and processed to completion. Furthermore, premanufacturing the wafers 34, 66 and chips 81 enables any faulty wafers 34, 66 or chips 81 to be detected and disposed of before they are coupled together which thereby increases the overall yield of the array manufacturing process.

Figure 12:
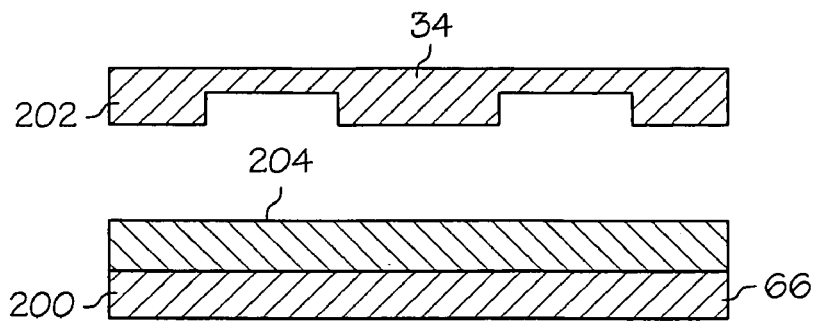
FIGS. 12–14 are a series of side cross sections illustrating a series of steps for coupling wafers together.
Figure 13:
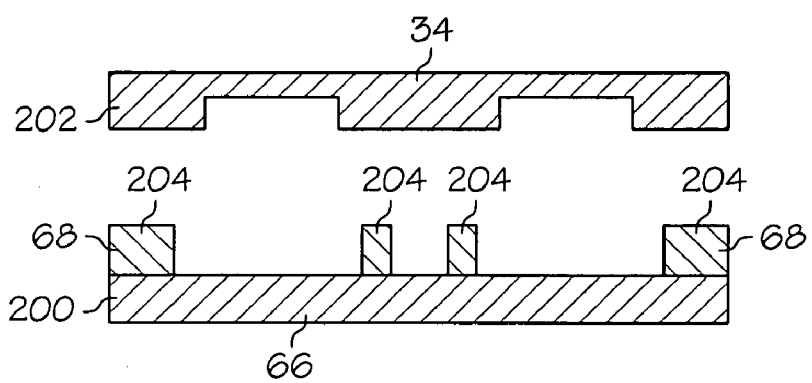
Figure 14:
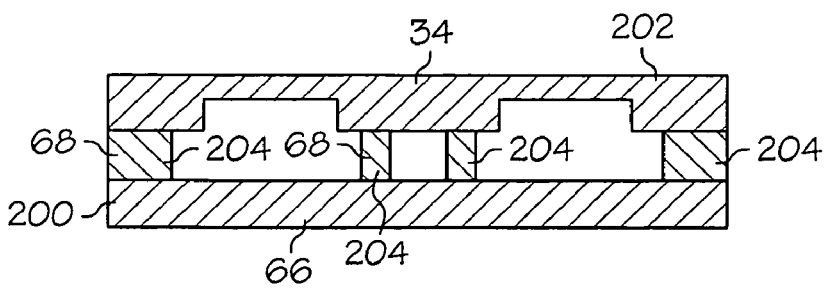

FIGS. 12–14 illustrate one method for coupling the upper 34 and lower 66 wafers together, such as during the step shown in FIG. 9 above. For ease of illustration, FIGS. 12–14 illustrate two generic wafers 200, 202 being coupled together, although it should be understood that the wafers 200, 202 can correspond to the upper 34 and lower 66 (as well as any other wafers which are desired to be coupled).

The wafers 200, 202 may first be cleaned and an adhesion promoter may be applied to the wafers 200, 202. A layer of benzocyclobutene ("BCB" trade name CYCLOTENE® 4024-40 manufactured by the Dow Chemical Company of Midland, Mich.), which is a negative tone photoresist, 204 may be applied to at least one of the wafers 200, 202, such as by spinning the BCB layer 204 thereon. (FIG. 12). Materials other than BCB may also be used as the bonding layer 204. For example, polyimide, SU8 (a negative, epoxy-type, near-UV photoresist based on EPON SU-8 epoxy resin sold by Shell Chemical), or other patternable or photopatternable adhesives with a low cure temperature may be used. The layer 204 may be spun to any desired thickness, such as a thickness of between about 0.25 microns or less and about 20 microns or more, and in one embodiment the layer 204 has a thickness of about 4.5 microns.

Next, the layer 204 may be exposed to a "soft bake" to at least partially harden the layer 204 for subsequent photo-patterning. In one embodiment, the soft bake includes exposing the wafer 200 to a temperature of about of about 75° C. for about 180 seconds. However, the soft bake may be carried out for sufficient time and under sufficient temperatures until the layer 204 is sufficiently hardened or cured to allow photopatterning of the layer 204, while still allowing sufficient solvents to remain in the layer 204 for subsequent bonding. The soft bake elevates the glass transition temperature of the BCB for safe handling at room temperature.

Next, the layer 204 may be patterned by, for example, exposing portions of the layer 204 which are desired to remain to electromagnetic (i.e. UV) radiation while shielding portions of the layer 204 which are not desired to be removed from the radiation. The UV radiation initiates crosslinking in the exposed portions of the layer 204 while the shielded portions of the layer 204 are protected, such as by a mask, from the radiation to prevent crosslinking. In this case, any portions of the wafer 200 (or wafers 34,66) which are desired to be contacted and adhered to the wafer 202 may be exposed to the radiation. The layer 204 may then undergo a pre-develop bake to further encourage crosslinking of portions of the layer 204 which are not desired to be removed. In one embodiment, the pre-develop bake may include exposure to a temperature of about 75° C. for about 90 seconds. However, the pre-develop bake may be carried out for sufficient times and under sufficient temperatures until the portions of the layer 204 which are desired to remain are sufficiently crosslinked.

The non-crosslinked portions of the layer 204 may then be removed in a develop process using a puddle or immersion developer process. The wafer 200 may then be dried thereby resulting in the wafers 200, 202 shown in FIG. 13. The wafer 200 may then be cleaned in a "descumming" process to remove any residual, dilute BCB on the wafer 200.

The layer 204 may then be allowed to cure at room temperature (i.e. about 68° F. or 20° C.) for about 8 hours. However, this BCB cure step may be carried out for sufficient times and under sufficient temperatures to raise the glass transition temperature of the layer 204 to provide a stable BCB layer 204 and control reflow of the layer 204 during subsequent processing (except for during bonding). This BCB cure step further elevates the glass transition temperature of the layer 204 in preparation of bonding.

The wafers 200, 202 may then be placed into contact in the desired orientation and pressed together for bonding (FIG. 14). In one embodiment, the bond is cured by exposing the wafers 200, 202 to temperature of about 250° C. under a force of about 100 lb for about 30 minutes. However; this bond cure step may be carried for sufficient times and under sufficient temperatures and pressures until the portions of the layer 204 form a sufficient bond between the wafers 200, 202.

Thus, BCB layer 204 provides a photopatternable adhesive for the wafers 200, 202 so that the adhesive 204 can be easily patterned and arranged in the desired manner. Further, the layer 204 can be easily deposited, provides wafer rework capabilities and is generally homogeneous.

Figure 15:
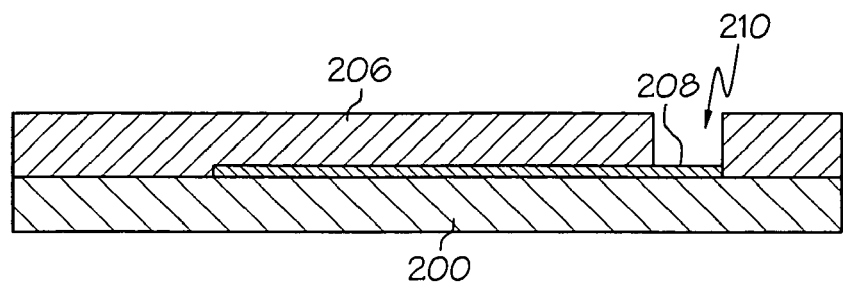
FIGS. 15–19 are a series of side cross sections illustrating a series of steps for depositing a passivation layer and bonding wafer portions.

BCB or other similar materials can also be used as a passivation or electrical isolation layer. For example, as shown in FIG. 15, a BCB passivation layer 206 can be located over any conductive portions or layers which are desired to be isolated, such as a metallic interconnect layer 208. The passivation layer 206 can be located on the wafer 200/interconnect layer 208 and spun to form an even coating having nearly any desired thickness. The soft bake and photo patterning steps described above in the context of FIGS. 12–14 may then be used so that undesired portions of the passivation layer 206 are removed. For example, the passivation layer 206 may be etched to form a via 210 to expose at least a portion of the metal interconnect 208.

The passivation layer 206 may then be "hard" cured to generally fully cure the BCB and generally drive out any solvents to provide a hard, stable passivation layer 206. The hard cure may raise the glass transition temperature of the passivation layer 206 beyond bond temperatures so that any subsequent bonding steps involving the wafer 200 do not affect or cause reflow of the passivation layer 206, and so that the passivation layer 206 is generally insensitive to light and generally inert to BCB ancillary chemical and etchants.

Figure 16:
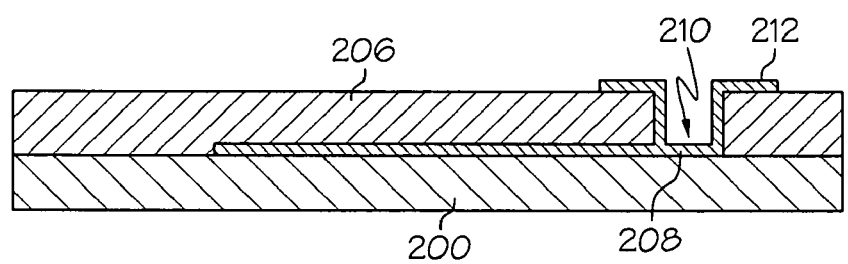
Figure 17:
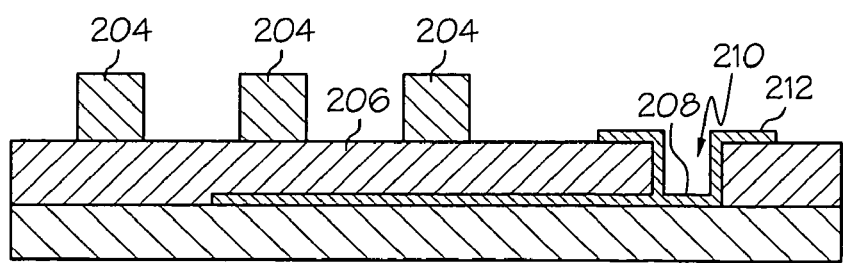

If desired, leads 212 (FIG. 16) may then be deposited onto the passivation layer 206 and in contact with the metal interconnect 208. Of course, various other steps, etching, manufacturing, processing and the like can occur at this stage as well. Next, a bonding layer 204 (such as BCB) may be located on top of the.passivation layer 206. The bonding layer 204 may then be etched, baked, cured, and otherwise processed as described above in order to enable the wafer 202 to be coupled to the wafer 200. FIG. 17 illustrates the bonding layer 204 after etching.

Figure 18:
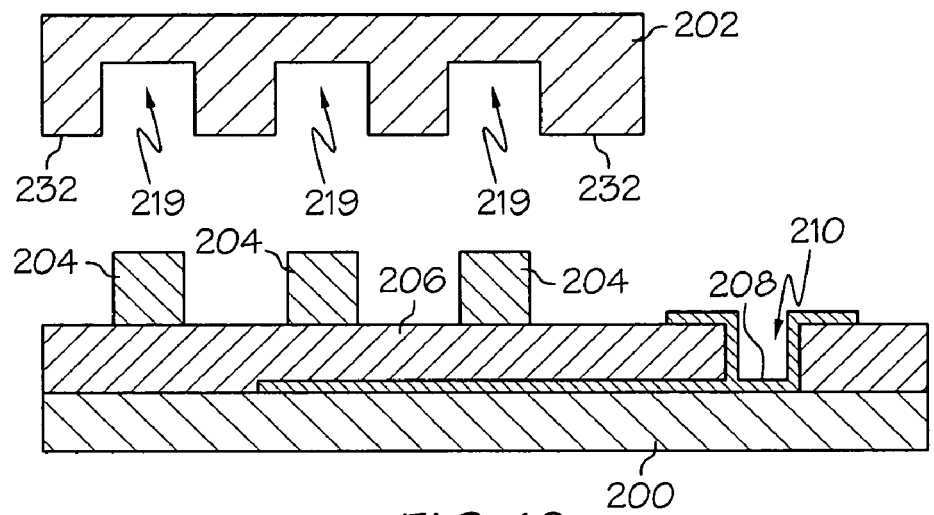
Figure 19:
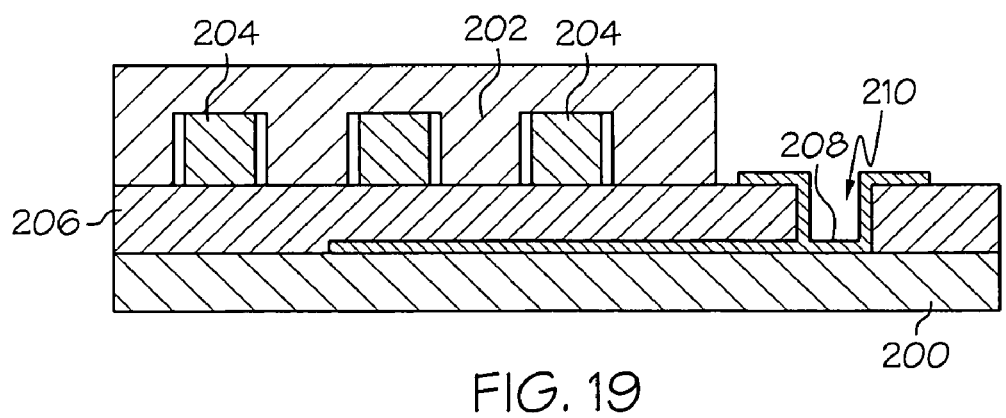

Wafer 202, which is desired to be coupled to wafer 200, may then be provided, as shown in FIG. 18. In the illustrated embodiment, wafer 202 includes a plurality of cutouts or notches 219 formed therein, with each notch being sized and located to receive a portion of the BCB bonding layer 204 therein. The wafer 202 may then be located on top of passivation layer 206 and the bonding layer 204, as shown in FIGS. 18 and 19. Heat and temperature are then applied to the wafer stack to bond the wafer 202 to the wafer 200 as described above in the context of FIG. 14. The wafer 200 may be bonded to the wafer 202 at a temperature above the glass transition temperature of the bonding layer 204, but below the glass transition temperature of the passivation layer 206.

The passivation layer 206 may be located between any portions of the wafers 200, 202 to ensure that the wafers 200, 202 remain electrically isolated due to the dielectric qualities of BCB. For example, the lower or bond surface 232 of the wafer 202 contacts the passivation layer 206, instead of the lead 208. In this manner, the passivation layer 206 electrically isolates the wafer 202 from the lead 208, and from the wafer 200. Thus, the layer 206 can be used as a passivation layer.

It should be understood that the bonding and bonding/passivation step shown in FIGS. 15–19 may be used for nearly any wafer or wafer portions. In particular, the bonding and bonding/passivation method as disclosed therein may be used in any microstructure to couple and/or passivate a microstructure or various portions of a microstructure. Such microstructures may, in one embodiment, include the array 10 disclosed herein, but the processes disclosed herein can also be used with a wide variety of other microstructures beyond the array 10, including a wide variety of sensors or actuators.

Having described the invention in detail and by reference to the preferred embodiments, it will be apparent that modifications and variations thereof are possible without departing from the scope of the invention.

What is claimed is:

1. A microstructure system including:
    a wafer portion including a microstructure formed therein, located thereon or supported thereby wherein said wafer portion includes an upper wafer portion and a lower wafer portion located generally below and at least partially spaced apart from said upper wafer portion, and wherein said microstructure is formed in or located on said upper wafer portion, and wherein said upper wafer portion defines a coverage area in top view;
    a plurality of solderable surfaces electrically or operatively coupled to said microstructure and wherein said solderable surfaces are formed or located on said lower wafer portion and are not located within said coverage area such that said solderable surfaces are not positioned under said upper wafer portion and are exposed to provide ease of access to said solderable surfaces, said solderable surfaces being arranged in a pattern; and
    an electronic component having a plurality of contacts located thereon, said plurality of contacts being arranged in a pattern corresponding to said pattern of said solderable surfaces such that said electronic component is directly mechanically and electrically attachable to said solderable surfaces by a flip chip bonding process and without the use of wire bonds such that said electronic component can control, operate or receive inputs from at least part of said microstructure.

2. The microstructure system of claim 1 wherein said upper wafer portion includes an outer perimeter, and wherein said outer perimeter defines said coverage area.

3. The microstructure system of claim 1 wherein said lower wafer portion has a coverage area in top view and wherein said coverage area of said upper wafer portion is entirely contained within said coverage area of said lower wafer portion.

4. The microstructure system of claim 1 wherein said upper and lower wafer portions are directly coupled together.

5. The microstructure system of claim 4 wherein said upper wafer and lower wafer portions are coupled together by a photopatternable adhesive.

6. The microstructure system of claim 5 wherein said photopattemable adhesive is benzocyclobutene.

7. The microstructure system of claim 4 wherein said upper wafer and lower wafer portions are coupled together by a relatively low reflow temperature adhesive, said adhesive having a reflow temperature of less than about 125° C.

8. The microstructure system of claim 1 wherein said solderable surfaces are a flip chip connection site configured to receive a chip thereon by flip chip bonding.

9. The microstructure system of claim 1 wherein each solderable surface includes a conductive pad, each pad being electrically isolated from any adjacent pad and having a melting point of less than about 250° C.

10. The microstructure system of claim 1 wherein said electronic component is a chip and wherein said chip is coupled to said solderable surfaces by flip chip bonding.

11. The microstructure system of claim 1 further including an external controller coupled to said electronic component to control the input to or output from said electronic component to thereby control or monitor the input to or output from said microstructure.

12. The microstructure system of claim 1 wherein said microstructure is at least one of a sensor or an actuator.

13. The microstructure system of claim 1 wherein said microstructure is a mirror array including a plurality of movable reflective surfaces.

14. The microstructure system of claim 13 further including at least one component which can control the movement of at least one of said reflective surfaces, wherein said solderable surfaces are electrically or operatively coupled to said at least one component.

15. The microstructure system of claim 14 wherein said component is an electrode for controlling the movement of said at least one movable reflective surface when a voltage or current is applied across said electrode.

16. The microstructure system of claim 15 wherein at least two electrodes are located below each of said reflective surfaces such that a voltage can be applied across said electrodes to cause the associated reflective surface to move in at least two generally opposite directions.

17. The microstructure system of claim 13 wherein each reflective surface is individually movable relative to any adjacent reflective surfaces and is individually controllable.

18. The microstructure system claim 13 wherein said solderable surfaces can carry a sufficient bandwidth to allow an external controller coupled to said solderable surfaces and to said electronic component to cause and control the individual movement of each reflective surface relative to any adjacent reflective surfaces.

19. The microstructure system of claim 1 wherein said coverage area of said upper wafer portion is smaller than the coverage area of said lower wafer portion.

20. The microstructure system of claim 13 wherein said upper wafer portion includes a silicon layer, and wherein said reflective surfaces are non-silicon material located on said silicon layer.

21. The microstructure system of claim 13 wherein said upper wafer portion includes a base portion and a plurality of movable portions rotatably coupled to base portion, and wherein each reflective surface is located on one of said movable portions.

22. The microstructure system of claim 1 wherein said upper wafer portion includes at least a portion of at least one silicon-on-insulator wafer.

23. The micro structure system of claim 1 wherein said lower wafer portion is or includes at least part of a semiconductor wafer, or a ceramic substrate, or a glass substrate, or a printed circuit board.

24. The microstructure system of claim 1 wherein said lower wafer portion includes an upper surface facing said upper wafer portion, and wherein said solderable surface is located on said upper surface.

25. The microstructure system of claim 1 wherein said upper wafer portion and said lower wafer portion are coupled together by an electrically insulating material such that said upper and lower wafer portions are not directly electrically connected.

26. The microstructure system of claim 1 wherein said electronic component is not located within said coverage area such that said electronic component is not positioned under said upper wafer portion to provide ease of mounting said electronic component.

27. The microstructure system of claim 1 wherein the entirety of said solderable surface is not located within said coverage area and is not positioned under said upper wafer.

28. The system of claim 1 wherein said wafer portion includes an exposed area that is outside said coverage area, and wherein electronic component is located generally entirely in said exposed area.

29. The system of claim 1 wherein said upper wafer portion is directly coupled to said lower wafer portion, and said electronics component is directly coupled to said lower wafer portion.

30. The system of claim 1 wherein said microstructure does not include any active electronics positioned directly below said upper wafer portion that can control, operate, or receive inputs from said microstructure.

31. The system of claim 1 wherein said upper wafer portion is directly coupled to said lower wafer portion, and said electronic component is directly attached to said lower wafer portion, and wherein said electronic component is generally not positioned directly under said upper wafer portion.

32. A microstructure system including:
an upper wafer portion including a microstructure formed therein, located thereon or supported thereby, said upper wafer portion defining a coverage area in top view;
a lower wafer portion located generally below and at least partially spaced apart from said upper wafer portion, said lower wafer portion including at least one electrode for controlling the movement of at least part of said microstructure;
a solderable surface formed or located on said lower wafer portion, wherein said solderable surface is not located within said coverage area such that said solderable surface is not positioned under said upper wafer portion to provide ease of access to said solderable surface; and
an electronic component coupled to said solderable surface by flip chip bonding without wire bonds and being electrically or operatively coupled to said electrode such that said electronic component can control or operate said electrode to thereby control or operate said microstructure.

33. The microstructure system of claim 32 wherein said upper wafer portion and said lower wafer portion are coupled together by an electrically insulating material such that said upper and lower wafer portions are not directly electrically connected.

34. The microstructure system of claim 32 wherein said lower wafer portion includes an upper surface facing said upper wafer portion, and wherein said solderable surface is located on said upper surface.

35. The microstructure of claim 32 wherein said electronic component is positioned between said lower wafer portion and said upper wafer portion.

36. The microstructure system of claim 32 wherein said electronic component is a separate component that is spaced apart from said electrode.

37. A microstructure system including:
a wafer portion including a microstructure formed therein, located thereon or supported thereby wherein said wafer portion includes an upper wafer portion and a lower wafer portion located generally below and at least partially spaced apart from said upper wafer portion, and wherein said microstructure is formed in or located on said upper wafer portion, and wherein said upper wafer portion defines a coverage area in top view and an exposed area that is outside said coverage area; and
a solderable surface configured to receive an electronic component thereon in a flip chip attachment process and without wire bonds, said solderable surface being formed on, located on, or supported by said wafer portion, said solderable surface being electrically or operatively coupled to said microstructure such that an electronic component coupled to solderable surface can control, operate or receive inputs from at least part of said microstructure and wherein said solderable surface is formed or located on said lower wafer portion and is located within said exposed area, wherein said upper wafer portion and said lower wafer portion are coupled together by an electrically insulating material such that said upper and lower wafer portions are not directly electrically connected.

38. The system of claim 37 wherein said upper wafer portion and said lower wafer portion are generally electrically insulated such that a current cannot be directly passed between said upper and lower wafer portions.

39. The microstructure system of claim 37 wherein said solderable surface includes a plurality of conductive pads arranged in a pattern configured to match a pattern of conductive contacts of an electronic component.

* * * * *